United States Patent [19]

Lucas

[11] Patent Number: 4,857,984
[45] Date of Patent: Aug. 15, 1989

[54] THREE-TERMINAL MOS INTEGRATED CIRCUIT SWITCH

[75] Inventor: Charles H. Lucas, Newport Beach, Calif.

[73] Assignee: Hughes Aircraft Company, Los Angeles, Calif.

[21] Appl. No.: 885,813

[22] Filed: Jul. 15, 1986

Related U.S. Application Data

[63] Continuation of Ser. No. 686,329, Dec. 26, 1984.

[51] Int. Cl.[4] .............................................. H01L 27/02
[52] U.S. Cl. .................................. 357/41; 357/23.12; 357/23.14; 307/571; 307/304
[58] Field of Search ..................... 357/41, 23.12, 23.14; 307/304, 577, 575, 571

[56] References Cited

U.S. PATENT DOCUMENTS

| | | | |
|---|---|---|---|
| 3,916,430 | 10/1975 | Heuner et al. | 357/41 |
| 4,152,716 | 5/1979 | Torii | 357/41 |
| 4,209,713 | 6/1980 | Satou et al. | 307/200 B |
| 4,477,742 | 10/1984 | Janutka | 307/571 |
| 4,509,070 | 4/1985 | Furumura | 357/41 |

Primary Examiner—Martin H. Edlow
Attorney, Agent, or Firm—Terje Gudmestad; Kenneth W. Float; A. W. Karambelas

[57] ABSTRACT

The MOS switch described herein includes first and second MOS devices serially connected in a common substrate. Each device includes source, drain and channel regions which are biased to conduction in series between input and output terminals of the switch in its "on" or conductive state. The novel device connection prevents any pn junction in either MOS device from becoming forward biased. This action, in turn, prevents any parasitic bipolar transistor action in either device after the MOS switch turns off. This latter operational feature eliminates the need for a fourth terminal through which a DC bias potential is applied to either MOS device, and thus undesirable shifts in threshold voltage produced by such DC bias are eliminated.

2 Claims, 1 Drawing Sheet

Fig. 1a. (PRIOR ART)
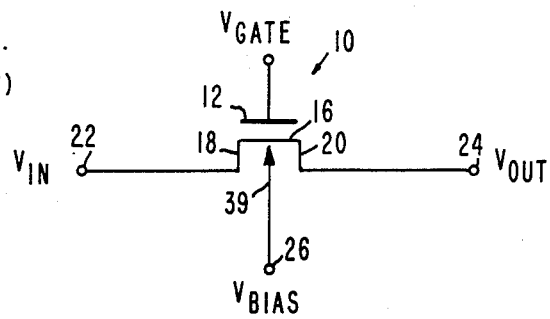
Fig. 1b. (PRIOR ART)
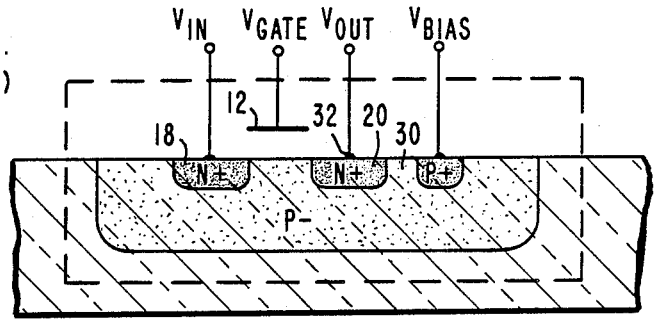
Fig. 2a.
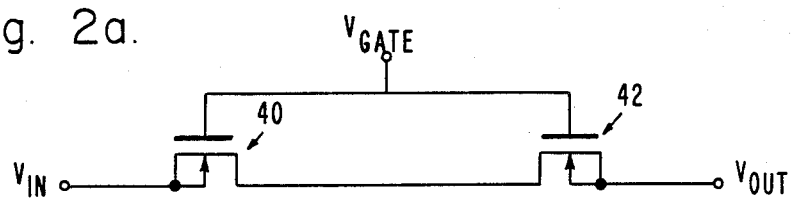
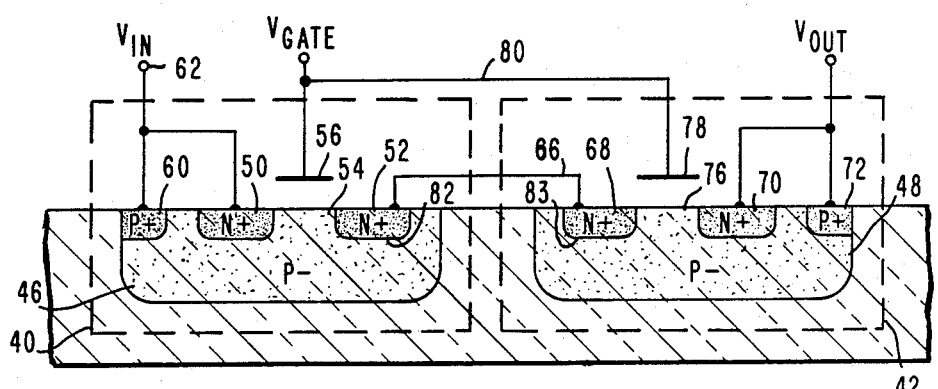
Fig. 2b.

THREE-TERMINAL MOS INTEGRATED CIRCUIT SWITCH

This application is a continuation of application Ser. No. 06/686,329 filed Dec. 26, 1984.

BACKGROUND OF THE INVENTION

1. Field of the Invention

This invention relates generally to metal-oxide-semiconductor (MOS) switching devices of the type used in switched capacitor filters and related circuits. More particularly, the invention is directed to a novel three-terminal integrated circuit (IC) switching structure in which undesirable parasitic transistor action and undesirable shifts in the threshold or turn-on voltage of the MOS device or devices have been eliminated.

2. Description of Related Art

In the manufacture of certain types of MOS integrated circuit switching circuits, such as switched capacitor filters, it is necessary to fabricate a switching device in a semiconductor substrate and isolate the device in a p type or n type "well" which has been ion implanted and diffused into the substrate using state-of-the-art ion implantation and/or diffusion techniques. This construction is necessary in order to electrically isolate these switching devices from other devices which are part of a monolithic integrated circuit built in a common semiconductor substrate. These MOS switching devices may also function as an input device of an analog sample-and-hold (S/H) circuit, or as a series-connected devices known as a "transmission gate" in a logic circuit.

In all of the above types of switching circuits, the MOS switch will normally function quite satisfactorily in the "on" or conductive state. However, after the MOS switching device is turned off, the input or output node of the device may be driven too far negative or to far positive with respect to the potential of the well region which isolates the device in a common substrate. In one direction, this excessive voltage swing will, in turn, forward bias the input or output pn junction of the MOS switch and, in turn, produce parasitic transistor action, for example, between an n type substrate, a p type isolating well and the n type source or drain region of the MOS field-effect transistor (MOSFET). Typically, the undesirable parasitic bipolar transistor action in the above n-p-n regions may have a gain or beta, $\beta$, of 200 and may produce as much as 10 milliamps of parasitic current drain for a forward bias of 700 millivolts of a source or drain region with respect to its isolating well.

It is possible to eliminate this undesirable parasitic transistor action by applying a predetermined reverse DC bias potential to the p or n type well and thus prevent the input or output (source or drain) pn junction of the MOS device from becoming forward biased. However, the application of a reverse bias potential to the well region, in turn, introduces a corresponding undesirable increase in threshold or turn-on voltage for the device. This threshold increase is commonly known as the "source-bulk" or "source-body" voltage effect. An additional terminal for the well device must be provided and connected by a conductive path to a source of reverse bias DC potential. These disadvantages, including the above undesirable parasitic transistor action, will be better understood in the description that follows below with reference to the prior art circuitry and structure shown in the drawings.

SUMMARY OF THE INVENTION

The present invention provides a unique solution to the above problems of parasitic transistor action and undesirable increases in threshold voltages by providing a novel three-terminal integrated circuit MOS switching structure. This structure comprises a semiconductor substrate of one conductivity type which includes first and second MOS devices therein. These devices include, respectively, first and second adjacent and isolated wells of conductivity type opposite to the substrate and are formed adjacent to the upper major surface of the substrate. Each well has a source and a drain region of conductivity type opposite to the well and a channel region extending therebetween. A well contact of conductivity type the same as the well is formed in each well. The contact of the first well is connected to the switch input terminal and the contact of the second well is connected to the switch output terminal.

First and second gate electrodes are disposed, respectively, above the channel regions in each well and are both connected to a common gate terminal for receiving a gate control voltage. The source and well contact of the first MOS device are connected to a common switch input terminal and the drain and well contact of the second MOS device are connected to a common switch output terminal. Additionally, the drain of the first MOS device is connected directly to the source of the second MOS device, so that the application of a positive gate control voltage, VGATE to both the first and second gate electrodes will simultaneously turn on both of these MOS devices and provide a conductive path between input and output terminals of the switch. Hence, the switch is in its "on" or conductive state.

When the gate control voltage switch $V_{GATE}$ switches to a potential that is lower than that of both switch input source and output drain, both MOS devices are turned off. At this time, either the p-n junction between well and source of the second or output MOS device or the p-n junction between well and drain of the first or input MOS device must be reverse biased, thereby preventing current from flowing in the path between the drain of the first MOS device and the source of the second MOS device. This action in turn prevents parasitic bipolar transistor action within both MOS devices and eliminates the need for a conductive path between a separate source of reverse bias potential and the well contact.

The above and other advantages and features of the present invention will become more readily apparent in the following description of the accompanying drawings.

BRIEF DESCRIPTION OF THE DRAWINGS

FIGS. 1a and 1b illustrate schematically an MOS switching device according to the prior art.

FIGS. 2a and 2b illustrate the novel MOS integrated circuit switching structure and associated circuitry constructed in accordance with the present invention.

DETAILED DESCRIPTION

Referring now to FIG. 1, there is shown schematically in FIG. 1a a four-terminal MOS switch 10 having its insulated gate electrode 12 connected to a gate terminal 14 for receiving a turn-on and turn-off gate voltage, $V_{GATE}$. The MOS device 10 further includes a main channel region 16 which is connected at one end to a source electrode 18 and at the other end to a drain electrode 20. The source and drain electrodes 18 and 20 are connected, respectively, to input and output terminals 22 and 24, and a bias terminal 26 is connected to a well contact 39. The DC bias applied to terminal 26 is necessary to prevent undesirable parasitic bipolar transistor action in this MOS switch.

The above undesirable parasitic transistor action in FIG. 1 may be better understood by referring to the structural-schematic diagram of FIG. 1b wherein the p− well region 28 is formed by ion implantation and/or diffusion into typically an n− substrate 30. The source and drain regions 18 and 20 are heavily doped n+ regions at the upper surface of the p− well region 28, and an insulated gate electrode 12 is disposed above the channel region 16 extending between these n+ source and drain regions 18 and 20.

When an appropriate level of positive gate voltage $V_{GATE}$, is applied to the gate electrode 12, this positive potential causes electrons to accumulate at the surface of the device substrate, thereby forming a channel region of n type conductivity extending between the source and drain regions 18 and 20. This electric field action forms an n type conductive path or channel (not shown) between input and output terminals 22 and 24 is typical of the MOS switch 10 in its "on" or conductive state.

After the MOS switch 10 turns off as the gate voltage on terminal 14 has been driven to a low potential, there is often a tendency for preceeding circuit or input device (not shown, but connected to the input terminal 22) to drive the potential at the source region 18 sufficiently negative to forward bias the pn junction 34 in the structure of FIG. 1b. This forward bias action, in turn, produces parasitic bipolar transistor action as carriers are injected from the n+ source source region 18, through the p− well 16 and into the n− substrate 30.

In order to eliminate this undesirable parasitic transistor action in the MOS switch of FIG. 1b, it becomes necessary to apply a bias potential to the bias terminal 26 which is sufficiently negative to prevent forward biasing of the pn junction 34 when the switch 10 turns off. However, this requirement for a negative bias potential 26 to be applied to the p− well region 28 not only means that a conductive path from that region to the bias potential must be provided, as previously mentioned, but more important, the bias potential produces a DC voltage threshold shift in the device. That is, it now requires a larger positive gate voltage, $V_{GATE}$, to be applied to the gate electrode 12 in order to turn this switch on. This shift in threshold voltage for the switch 10 can be a severe disadvantage in certain linear circuitry, for example, where there are available only very low level voltage swings at the gate terminal 14 for turning the switch 10 on and off. Thus, this operational limitation caused by the requirement of a negative potential $V_{BIAS}$ at terminal 26 makes the prior art MOS switch 10 totally unsuitable for operation at certain low levels of logic swings at the gate electrode 12.

Referring now to FIGS. 2a and 2b, the novel three-terminal switching structure and integrated circuit shown in these figures has eliminated the above problem of parasitic transistor action and the requirement for a well bias terminal and the increase in gate threshold voltage resulting from the well to source reverse bias. This structure is realized by the provision of two adjacent MOS devices, which have been generally designated 40 and 42 and will be herein-after referred to as first and second MOS switching devices. These devices 40 and 42 are formed, as shown, in a common n− substrate 44 and include first and second p− wells 46 and 48 respectfully which are formed using conventional ion implantation and/or diffusion techniques.

The first p− well 46 includes n+ source and drain regions 50 and 52, respectively, which define the lateral extent of the device channel region 54. A gate electrode 56 is disposed, as shown, above the channel region 54 and is connected to a common gate input node 58. The first MOS device 40 includes a heavily doped input contact p+ region 60 which is commonly connected at an input terminal 62 with the n+ source region 50. The output node 64 of the first MOS switching device 40 is connected directly by way of conductive line 66 to the n+ source region 68 of the second MOS switching device 42.

The second MOS device 42 includes an n+ drain region 70 and an output contact p+ region 72 connected, as shown, to a single output terminal 74 from which an output voltage may be derived. The output MOS device 42 also includes a channel region 76 above which is disposed a gate electrode 78 commonly connected by way of line 80 to the input gate terminal 58.

Operation

When a gate voltage VGATE of sufficient magnitude is applied to the gate electrodes 56 and 78 of the IC device structure of FIG. 2b, the p− conductivity of the surface regions (channels of the wells 46 and 48) between the source and drain regions of each device 40, 42 are converted from p to n type conductivity and thus provide two n type conductive channels serially connected between the input terminal 62 and the output terminal 74. In this mode, the MOS switch in FIGS. 2a and 2b is closed and is switched from non-conduction to conduction by the utilization of only three terminals 58, 62 and 74.

However, when the MOS device structure in FIGS. 2a and 2b is turned off as the gate voltage $V_{GATE}$ is lowered on the gate electrodes 56 and 78, neither source 50 nor drain 52 of device 40, nor source 68 or drain 70 of device 42 may become strongly forward biased with respect to their respective well regions 46 and 48 and, therefore, no parasitic bipolar transistor action may occur. Source 50 may not become forward biased to well 46 because it is shorted to it through contact 60. Drain 70 may not become forward biased to well 48 because it is shorted to it through contact 72. Source 68 may not become forward biased to well 48 as a result of a negative excursion of input terminal 62 voltage with respect to output terminal 74 voltage because junction 82 is reverse biased for this condition and blocks current flow. Similarly, drain 52 may not become forward biased to well 46 as a result of a positive excursion of input terminal 62 voltage with respect to output terminal 74 voltage, because junction 83 is reverse biased for this condition and blocks current flow. This total elimination of any parasitic transistor action in both input MOS device 40 and output MOS device 42 therefore eliminates the requirement for a bias voltage, $V_{BIAS}$, as indicated at 26 in FIG. 1b. This features enables the on and off switching operation of the structure of FIG. 2b to be accomplished by a three-terminal structure rather than a four-terminal structure and without the introduction of any threshold voltage shifts into the switching operation.

Obviously, certain modifications may be made to the integrated switching structure shown in FIG. 2 without departing from the scope of the present invention. For example, the p and n conductivity types may obviously be reversed within the scope of the present invention, and the particular doping levels therein may be modified in accordance with a particular type of a circuit application, considering power, speed and capacitive load driving requirements and the like.

By way of example, the n− substrate 44 doping concentration is typically $3 \times 10^{15}$ atoms per cubic centimeter, the p− wells 46 and 48 are typically $1 \times 10^{16}$ atoms per cubic centimeter, the n+ source and drain regions 50, 52, 68, 70 are typically $1 \times 10^{20}$ atoms per cubic centimeter, and the p+ input and output and output regions 60 and 72 are typically $1 \times 10^{19}$ atoms per cubic centimeter. The n− substrate 44 is typically 400 micrometers in thickness and will have a surface oxide, $SiO_2$, thereon (not shown) beneath the gate electrodes 56 and 78 of about 600 Angstroms. The gate electrodes 56 and 78 will typically be thin lines of polycrystalline silicon which have been doped to a restivity of about 20 ohms per square centimeter. For this example, a gate voltage $V_{GATE}$ of only 2 volts higher than either input or output terminal voltage is needed to turn the device on.

The present invention is not limited in its use and application to the particular series switching circuit in FIG. 2, and may in fact be used to replace individual MOSFETs in a variety of MOS integrated circuits. For example, the three terminal switch disclosed and claimed herein may be used to replace one of the N channel MOSFETs in the transmission gate of the channel charge compensation switch disclosed and claimed in my U.S. Pat. No. 4,467,227 which I incorporate herein by reference.

What is claimed is:

1. A three-terminal integrated circuit switching structure comprising:

a semiconductor substrate of a first conductivity type;

first and second electrically isolated wells of a second conductivity type formed in said substrate;

a first MOS device formed in said first well, said first MOS device comprising source and drain regions of said first conductivity type and a channel region extending therebetween, a gate electrode disposed over said channel region, and an input contact region of said second conductivity type, said source and input contact regions being connected to a common input terminal; and a second MOS device formed in said second well, said second MOS device comprising source and drain regions of said first conductivity type and a channel region extending therebetween, a gate electrode disposed over said channel region, and an output contact region of said second conductivity type, said drain and output contact regions being connected to a common output terminal;

the gate electrodes of said first and second MOS devices being connected to a common gate terminal;

the drain region of said first MOS device being connected to the source region of said second MOS device;

whereby the application of a predetermined gate potential to said gate electrodes will simultaneously turn on both of said MOS devices and drive said structure to a conductive state, and whereby the removal of said gate potential will turn off both of said MOS devices.

2. A three-terminal integrated circuit switching structure comprising:

a semiconductor substrate of a first conductivity type;

first and second adjacently disposed, electrically isolated wells of a second conductivity type formed in said substrate;

a first MOS device formed in said first well, said first MOS device comprising source and drain regions of said first conductivity type and a channel region extending therebetween, a gate electrode disposed over said channel region, and an input contact region of said second conductivity type said source and input contact regions being connected to a common input terminal; and a second MOS device formed in said second well, said second MOS device comprising source and drain regions of said first conductivity type and a channel region extending therebetween, a gate electrode disposed over said channel region, and an output contact region of said second conductivity type, said drain and output contact regions being connected to a common output terminal;

the gate electrodes of said first and second MOS device being connected to a common gate terminal;

the drain region of said first MOS device being connected to the source region of said second MOS device;

whereby the application of a predetermined gate potential to said gate electrodes will simultaneously turn on both of said MOS devices and drive said structure to a conductive state, and whereby the removal of said gate potential will turn off both of said MOS devices.

* * * * *